US012334811B2

(12) United States Patent
Brambilla et al.

(10) Patent No.: US 12,334,811 B2
(45) Date of Patent: Jun. 17, 2025

(54) CLOSED LOOP STABILITY RAMP IMPLEMENTATION FOR CONSTANT ON-TIME BUCK CONVERTER

(71) Applicant: STMicroelectronics International N.V., Geneva (CH)

(72) Inventors: Niccolo' Brambilla, San Donato Milanese (IT); Sandro Rossi, Pavia (IT); Valeria Bottarel, Novara (IT); Stefano Corona, Borgarello (IT); Fulvio Ottavio Lissoni, Cusago (IT)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 33 days.

(21) Appl. No.: 18/334,757

(22) Filed: Jun. 14, 2023

(65) Prior Publication Data
US 2024/0421691 A1 Dec. 19, 2024

(51) Int. Cl.
*H02M 1/088* (2006.01)
*H02M 3/157* (2006.01)
(Continued)

(52) U.S. Cl.
CPC .......... *H02M 1/088* (2013.01); *H02M 3/157* (2013.01); *H02M 3/158* (2013.01); *H03L 7/08* (2013.01)

(58) Field of Classification Search
None
See application file for complete search history.

(56) References Cited

U.S. PATENT DOCUMENTS

| 4,634,892 A * | 1/1987 | Isbell ...................... H03K 7/08 |
| | | 323/288 |
| 8,421,432 B2 * | 4/2013 | Hawkes ................ H02M 3/156 |
| | | 323/283 |

(Continued)

FOREIGN PATENT DOCUMENTS

| CN | 114785123 A | 7/2022 |
| CN | 115706506 A * | 2/2023 .......... H02M 1/0009 |

OTHER PUBLICATIONS

Yan et al., "Modeling and Design Optimization of Capacitor Current Ramp Compensated Constant On-time V2 Control," IEEE Transactions on Power Electronics, DOI:10.1109/TPEL.2017.2766259, Oct. 2017, 24 pages.

*Primary Examiner* — Thomas J. Hiltunen
(74) *Attorney, Agent, or Firm* — Slater Matsil, LLP

(57) ABSTRACT

An integrated circuit device includes: one or more switches of a Buck converter; and a control circuit for the Buck converter, including: a comparator configured to compare a feedback voltage of the Buck converter with a compensation ramp voltage; a pulse generator configured to generate, in response to a rising edge in a comparator output signal, a pulse signal for controlling the Buck converter; a transconductance amplifier (TA) configured to generate, at an output terminal of the TA, a current proportional to a difference between a reference voltage and the feedback voltage; a capacitor coupled between an output terminal of the TA and a reference voltage node; and a ramp signal generator configured to generate the compensation ramp voltage by adding a voltage at the output terminal of the TA and a ramp voltage having a gradient proportional to a switching frequency of the Buck converter.

19 Claims, 11 Drawing Sheets

(51) Int. Cl.
    *H02M 3/158*     (2006.01)
    *H03L 7/08*     (2006.01)

(56) References Cited

U.S. PATENT DOCUMENTS

| | | | |
|---|---|---|---|
| 8,786,270 B2* | 7/2014 | Wu | H02M 3/156 |
| | | | 323/288 |
| 8,922,183 B2* | 12/2014 | Dearborn | H02M 3/157 |
| | | | 323/283 |
| 9,058,043 B2* | 6/2015 | Lin | G05F 1/10 |
| 9,398,653 B2* | 7/2016 | Kuang | H05B 45/375 |
| 9,647,552 B2* | 5/2017 | Li | H02M 3/158 |
| 9,899,913 B2* | 2/2018 | Chang | H02M 3/156 |
| 10,333,403 B2 | 6/2019 | Huang et al. | |
| 10,594,209 B2* | 3/2020 | Chen | H02M 3/158 |
| 11,095,221 B1 | 8/2021 | Hsu | |
| 2012/0081094 A1 | 4/2012 | Luo et al. | |
| 2014/0084884 A1* | 3/2014 | Lee | H02M 3/157 |
| | | | 323/271 |
| 2016/0126852 A1 | 5/2016 | Freeman et al. | |
| 2017/0229965 A1 | 8/2017 | Parto | |
| 2022/0385177 A1 | 12/2022 | Delepaut et al. | |
| 2023/0421062 A1* | 12/2023 | Yu | H02M 3/158 |

\* cited by examiner

| $F_{SW}$ [KHz] | $T_{SW}$ [μs] | $S_x$ [KV/s] | $V_{RAMP\_EQ}$ [mV] |
|---|---|---|---|
| 100 | 10 | 2 | 20 |
| 200 | 5 | 4 | 20 |
| 300 | 3.33 | 6 | 20 |
| 400 | 2.5 | 8 | 20 |
| 500 | 2 | 10 | 20 |
| 600 | 1.67 | 12 | 20 |
| 700 | 1.42 | 14 | 20 |
| 800 | 1.25 | 16 | 20 |
| 900 | 1.11 | 18 | 20 |
| 1000 | 1 | 20 | 20 |

Fig. 6

CLOSED LOOP STABILITY RAMP IMPLEMENTATION FOR CONSTANT ON-TIME BUCK CONVERTER

TECHNICAL FIELD

The present invention relates generally to switched-mode power supply (SMPS), and in particular embodiments, to Constant On-Time (COT) Buck converters with internal ramp compensation.

BACKGROUND

Power converters are pervasive in many electronic applications from computers to automobiles. In some embodiments, voltages within a power converter are generated by performing a DC-DC, DC-AC, and/or AC-DC conversion by operating a switch loaded with an inductor or transformer. Examples of power converters include switched mode power supplies (SMPS) and linear regulators. An SMPS is usually more efficient than other types of power conversion systems because power conversion is performed by controlled charging and discharging of the inductor or transformer and reduces energy lost due to power dissipation across resistive voltage drops.

An SMPS usually includes at least one switch (also referred to as a power switch) and an inductor or transformer. Some specific topologies include Buck converters, boost converters, and flyback converters, among others. A control circuit is commonly used to open and close the switches to charge and discharge the inductor. In some applications, the current supplied to the load and/or the voltage supplied to the load is controlled via a feedback loop. In some typologies, the switches used in the SMPS are implemented using cascode switches. Linear regulator is another class of power converter where a pass transistor is controlled (e.g., turned on and off) by a controller to provide a steady voltage to an external load.

Buck converter is a popular choice of SMPS and is often used to provide power for a downstream device such as a sensor or a processor. Constant On-Time (COT) control for DC-DC converters allows for fast transient response, but may require careful compensation design. The stability of COT Buck converters is usually addressed with ripple injection strategies using external components, e.g., Equivalent Serial Resistor (ESR), or Time Constant Matching Filter (TCMF). However, using ESR lowers the efficiency of the Buck converter, and the high number of bulky external components used in TCMF is undesirable for customers in terms of cost, complexity, and space required. There is a need in the art for a control circuit that can be integrated with the Buck converter in a same integrated circuit (IC) device, and requires little or no external components.

SUMMARY

In accordance with an embodiment, a switched-mode power supply (SMPS) includes: a Buck converter and a control circuit for the Buck converter. The control circuit includes: a comparator configured to compare a feedback voltage of the Buck converter with a compensation ramp voltage; a pulse generator coupled to an output terminal of the comparator and configured to generate a pulse signal in response to a rising edge in an output signal of the comparator, wherein switching of the Buck converter is controlled by the pulse signal; a transconductance amplifier, wherein a first input terminal of the transconductance amplifier is configured to receive the feedback voltage, and a second input terminal of the transconductance amplifier is configured to receive a reference voltage; a first capacitor coupled between an output terminal of the transconductance amplifier and a reference voltage node; and a ramp signal generator configured to generate a ramp voltage and add the ramp voltage to a first voltage at the output terminal of the transconductance amplifier to generate the compensation ramp voltage, wherein the ramp voltage is a linear voltage signal, and the ramp signal generator is configured to adjust a gradient of the linear voltage signal in accordance with a switching frequency of the Buck converter.

In accordance with an embodiment, an integrated circuit (IC) device includes: one or more switches of a Buck converter and a control circuit for the Buck converter. The control circuit includes: a comparator configured to generate a comparator output signal by comparing a feedback voltage of the Buck converter with a compensation ramp voltage; a pulse generator configured to generate a pulse signal in response to a rising edge in the comparator output signal, wherein the Buck converter is configured to be controlled by a switching control signal derived from the pulse signal; a transconductance amplifier configured to generate, at an output terminal of the transconductance amplifier, a current proportional to a difference between a reference voltage and the feedback voltage; a first capacitor coupled between an output terminal of the transconductance amplifier and a reference voltage node; and a ramp signal generator configured to generate the compensation ramp voltage by adding a first voltage at the output terminal of the transconductance amplifier and a ramp voltage generated by the ramp signal generator, wherein the ramp voltage is a linear voltage signal having a gradient proportional to a switching frequency of the Buck converter.

In accordance with an embodiment, a method of operating a Buck converter includes: dividing an output voltage of the Buck converter to generate a feedback voltage; sending the feedback voltage to a first input terminal of a comparator; sending the feedback voltage and a reference voltage to a first input terminal of a transconductance amplifier and a second input terminal of the transconductance amplifier, respectively; generating, using a ramp signal generator, a compensation ramp voltage that is equal to a sum of a first voltage at an output terminal of the transconductance amplifier and a ramp voltage, wherein the ramp voltage is a linear voltage signal having a gradient that is proportional to a switching frequency of the Buck converter; sending the compensation ramp voltage to a second input terminal of the comparator; generating, using a pulse generator, a pulse signal comprising pulses corresponding to rising edges in an output signal of the comparator; and switching the Buck converter under control of a switching control signal derived from the pulse signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates the gradient of a compensation ramp voltage at different time instants within a period of the compensation ramp voltage, in an embodiment;

DETAILED DESCRIPTION OF ILLUSTRATIVE EXAMPLES

Figure 1:
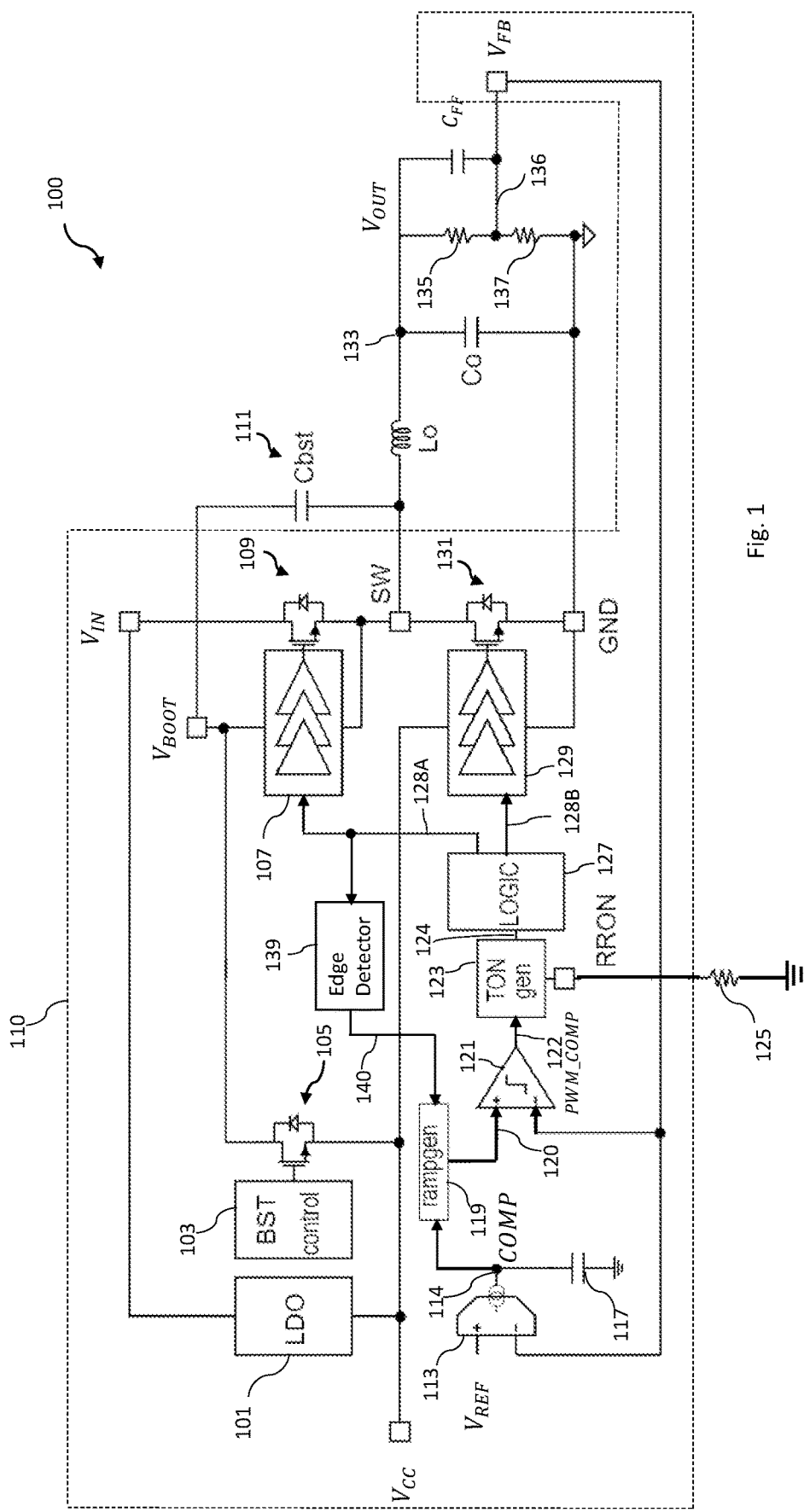
FIG. 1 illustrates a block diagram of a switched-mode power supply (SMPS), in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals or labels in different figures refer to the same or similar component or signal.

The present disclosure will be described with respect to examples in a specific context, namely a COT Buck converter with a control circuit for stability control. Most of the components of the COT Buck converter and the control circuit are integrated into a same integrated circuit (IC) device, with a few number of components implemented as external components of the IC device, in some embodiments.

FIG. 1 illustrates a block diagram of a switched-mode power supply (SMPS) 100, in an embodiment. Note that for simplicity, not all features of the SMPS 100 are illustrated.

The SMPS 100 in FIG. 1 is a Buck converter with a control circuit that achieves stability control for the Buck converter in a steady state of the Buck converter. As will be discussed in more details hereinafter, the Buck converter discussed herein is a COT Buck converter, and the control circuit of the Buck converter performs stability compensation through two feedback paths: a fast path that provides a feedback voltage $V_{FB}$ directly to a first input terminal of a pulse-width modulation (PWM) comparator 121, and a slow path that achieves better accuracy by providing a new set point (e.g., a voltage COMP) for the PWM comparator 121. A ramp signal generator 119 of the control circuit generates a linear ramp voltage having a gradient proportional to the switching frequency of the Buck converter, adds the linear ramp voltage to the voltage COMP to generate a compensation ramp voltage 120, and sends the compensation ramp voltage 120 to a second input terminal of the PWM comparator 121. A pulse generator 123 generates a pulse signal 124 having a fixed pulse width in response to rising edges in an output signal 122 of the PWM comparator 121. The pulse signal 124, or a switching control signal 128 derived from the pulse signal by a logic circuit 127, is used to control switching of the Buck converter.

In the example of FIG. 1, components within the dashed box are integrated together on a same semiconductor substrate (e.g., silicon) to form an integrated circuit (IC) device 110 or a portion of an IC device 110. An example of the IC device 110 may be a power-management integrated circuit (PMIC) device. The components outside the dashed box are referred to as external components connected to the IC device 110. The pins of the IC device 110 are illustrated in FIG. 1 as rectangular shaped connectors. As illustrated in FIG. 1, the number of external components needed for the IC device 110 is very small, which advantageously lowers the pin count for the IC device 110.

In FIG. 1, the Buck converter includes a switch 109 (also referred to as a high-side switch), a switch 131 (also referred to as a low-side switch), a gate driver circuit 107 for the switch 109, a gate driver circuit 129 for the switch 131, and a logic circuit 127 for generating the switching control signal 128 (e.g., 128A and 128B) from the pulse signal 124 generated by the pulse generator 123. The Buck converter further includes an inductor $L_0$ and a capacitor $C_O$. In the example of FIG. 1, the switches 109 and 131 are N-type transistors. In another embodiment, the switch 109 is a P-type transistor, and the switch 131 is an N-type transistor. These and other variations are fully intended to be included within the scope of the present disclosure.

The switch 109 is coupled between a pin $V_{IN}$ of the IC device 110 and a pin SW of the IC device 110, and the switch 131 is coupled between the pin SW and a pin GND. The pin $V_{IN}$ is configured to receive a supply voltage (e.g., a voltage between +10V and +100 V), and the pin GND is configured to be connected to a reference voltage (e.g., electrical ground). The inductor $L_0$ is coupled between the pin SW and a node 133, and the capacitor $C_0$ is coupled between the node 133 and the pin GND. During operation of the Buck converter, the voltage at the node 133 is the output voltage $V_{OUT}$ of the Buck converter.

The gate driver circuits 107 and 129 are configured to receive a switching control signal 128A and a switching control signal 128B, respectively, and are configured to generates control signals (e.g., gate control signals) for the switches 109 and 131, e.g., by amplifying and/or voltage-shifting the switching control signals 128A and 128B, or by allowing or dis-allowing a voltage source to be applied as the gate-source voltage of a respective transistor 109 or 131. The switches 109 and 131 are transistors, in the illustrated embodiments. In an embodiment where the Buck converter works in a continuous conduction mode, and the switches 109 and 131 are the same type (e.g., N-type) of transistors, the logic circuit 127 generates the switching control signals 128A and 128B with opposite values (e.g., logic HIGH or logic LOW), thereby setting the switches 109 and 131 in opposite states (e.g., ON state or OFF state) during operation of the Buck converter. In other words, for the above example of continuous conduction mode, during operation of the Buck converter, the switch 109 is closed when the switch 131 is open, and switch 109 is open when the switch 131 is closed.

The Buck converter of FIG. 1 further includes a boot-strap capacitor in, a boot-strap control circuit 103, a switch 105 (e.g., a transistor 105), and a low-dropout (LDO) regulator 101. The boot-strap capacitor 11 is coupled between a pin $V_{BOOT}$ and the pin SW. The load path terminals (e.g., drain terminal and source terminal) of the transistor 105 are coupled between the pin $V_{BOOT}$ and a pin $V_{CC}$. The pin $V_{CC}$ is configured to be coupled to another supply voltage (e.g., a +5V voltage), which is derived (e.g., generated) from the supply voltage at the pin $V_{IN}$ by the LDO regulator 101 in the example of FIG. 1. Besides the LDO regulator, other types of linear regulators may also be used to generate the supply voltage at the pin $V_{CC}$. In some embodiments, the supply voltage at the pin $V_{CC}$ may be provided by an external voltage source outside the IC device 110 without using a regulator inside the IC device 110. During operation of the Buck converter, when the switch 109 (e.g., an N-type transistor) needs to be closed (e.g., needs to turn the transistor 109 ON), the boot-strap control circuit 103 turns off the switch 105, and the voltage across the boot-strap capacitor 111 (provided by the charge stored in the boot-strap capacitor 111) provides a gate-source voltage of, e.g., +5V, for the transistor 109 to turn ON the transistor 109. When the voltage at the pin SW is low (e.g., the corresponding voltage at the pin $V_{BOOT}$ is equal to or lower than the voltage at the pin $V_{CC}$) after the switch 109 is open (e.g., the transistor 109 turned OFF), the boot-strap control circuit 103 turns on the transistor 105, such that the supply voltage at the pin $V_{CC}$ charges the boot-strap capacitor in (e.g., to restore the +5V voltage across the boot-strap capacitor 111). The capacitance of the boot-strap capacitor in may be large, thus an external capacitor is used as the boot-strap capacitor 111, and the pin $V_{BOOT}$ is used to provide an electrical connection between the boot-strap capacitor 111 and the switch 105.

The Buck converter illustrated in FIG. 1 is merely a non-limiting example. Variations are possible and are fully intended to be included within the scope of the present disclosure. For example, the switch 131 in FIG. 1 may be replaced by a diode with its cathode connected to the pin SW and its anode connected to the pin GND.

The control circuit for the Buck converter and the operation of the control circuit are discussed hereinafter. In the illustrated embodiment of FIG. 1, components not belonging to the Buck converter belong to the control circuit.

Still referring to FIG. 1, the output voltage $V_{OUT}$ of the Buck converter is sent to a voltage divider formed by resistors 135 and 137, which are coupled between the node 133 and a reference node connected to a reference voltage (e.g., electrical ground). The output of the voltage divider, referred to as a feedback voltage 136, is sent to the pin $V_{FB}$ of the IC device 110. In the example of FIG. 1, a feedforward capacitor $C_{FF}$ is coupled between the node 113 and the pin $V_{FB}$. The feedforward capacitor $C_{FF}$ may be used to stabilize the system over a wide number of applicative points in terms of output voltage and frequency. In some embodiments, the feedforward capacitor $C_{FF}$ is omitted.

As illustrated in FIG. 1, the feedback voltage 136 is sent to an inverting input terminal of the PWM comparator 121 (also referred to as a comparator 121), and sent to an inverting input terminal of a transconductance amplifier 113. A reference voltage $V_{REF}$ is supplied to a non-inverting input terminal of the transconductance amplifier 113. The reference voltage $V_{REF}$ may be derived from an internal voltage of the IC device 110, and used for setting the target output voltage or the feedback voltage of the Buck converter, in some embodiments.

The transconductance amplifier 113 generates, at an output terminal 114 of the transconductance amplifier 113, an output current that is proportional to a difference between the reference voltage $V_{REF}$ and the feedback voltage 136. A capacitor 117 is coupled between the output terminal 114 and a reference voltage node (e.g., electrical ground). In some embodiments, the output current of the transconductance amplifier 113 charges the capacitor 117 and generates a voltage COMP at the output terminal 114.

The voltage COMP is sent to the ramp signal generator 119. In addition, a control signal 140 for the ramp signal generator 109, which is generated by an edge detector 139, is also sent to the ramp signal generator 119. In an embodiment, the edge detector 139 is a rising edge detector, which generates a narrow pulse (e.g., having a pulse width between a few nanoseconds and tens of nanoseconds) when a rising edge in the switching control signal 128A is detected. In other words, the edge detector 139 generates a narrow pulse in the control signal 140 in response to a rising edge in the switching control signal 128A, such that the narrow pulse occurs at the rising edge of the switching control signal 128A. The narrow pulses in the control signal 140 may be used as a reset signal for the ramp signal generator 119 and other circuits of the IC device 110.

The ramp signal generator 119 generates a linear ramp voltage, and adds the linear ramp voltage to the voltage COMP to generate the compensation ramp voltage 120 at its output terminal. The compensation ramp voltage 120 is sent to a non-inverting input terminal of the comparator 121 in the example of FIG. 1. Details of the linear ramp voltage and different embodiments of the ramp signal generator 119 are discussed hereinafter.

The comparator 121 compares the compensation ramp voltage 120 with the feedback voltage 136, and generates an output signal 122 (also referred to as a PWM_COMP signal). For example, if the compensation ramp voltage 120 is higher than the feedback voltage 136, the output signal 122 has a logic HIGH value; and if the compensation ramp voltage 120 is lower than the feedback voltage 136, the output signal 122 has a logic LOW value.

In the example of FIG. 1, the pulse generator 123 is configured to detect a rising edge in the output signal 122 and generate a pulse in the pulse signal 124 in response to the detection of the rising edge. The pulses in the pulse signal 124 have a fixed pulse width, and are used by the logic circuit 127 to generate the switching control signals 128A and 128B. For example, if the Buck converter works in the continuous conduction mode, then the pulse signal 124 may be passed through the logic circuit 127 and used as the switching control signal 128A, and a complement of the pulse signal 124 (e.g., generated by an inverter in the logic circuit 127) is used as the switching control signal 128B. If the Buck converter works in discontinuous conduction mode, then the logic circuit 127 may include additional circuits for generating the dead time where both switches 109 and 131 are open. In the illustrated embodiments, the pulse width (e.g., duration when the pulse signal 124 has a logic HIGH value) of the pulse signal 124 determines (e.g., equals to) the ON time of the switch 109, and since the pulse width of the pulse signal 124 is constant, the Buck converter discussed herein functions as a Constant On-Time (COT) Buck converter. Note that in FIG. 1, a resistor 125 is coupled to the pin RRON of the IC device 110, and is used to determine the pulse width of the pulse signal 124. Therefore, the pulse generator 123 illustrated in FIG. 1 inside the dashed box corresponds to portions of the pulse generator integrated in the IC device 110, the resistor 125 is part of the pulse generator, but is implemented as an external component.

Figure 2:
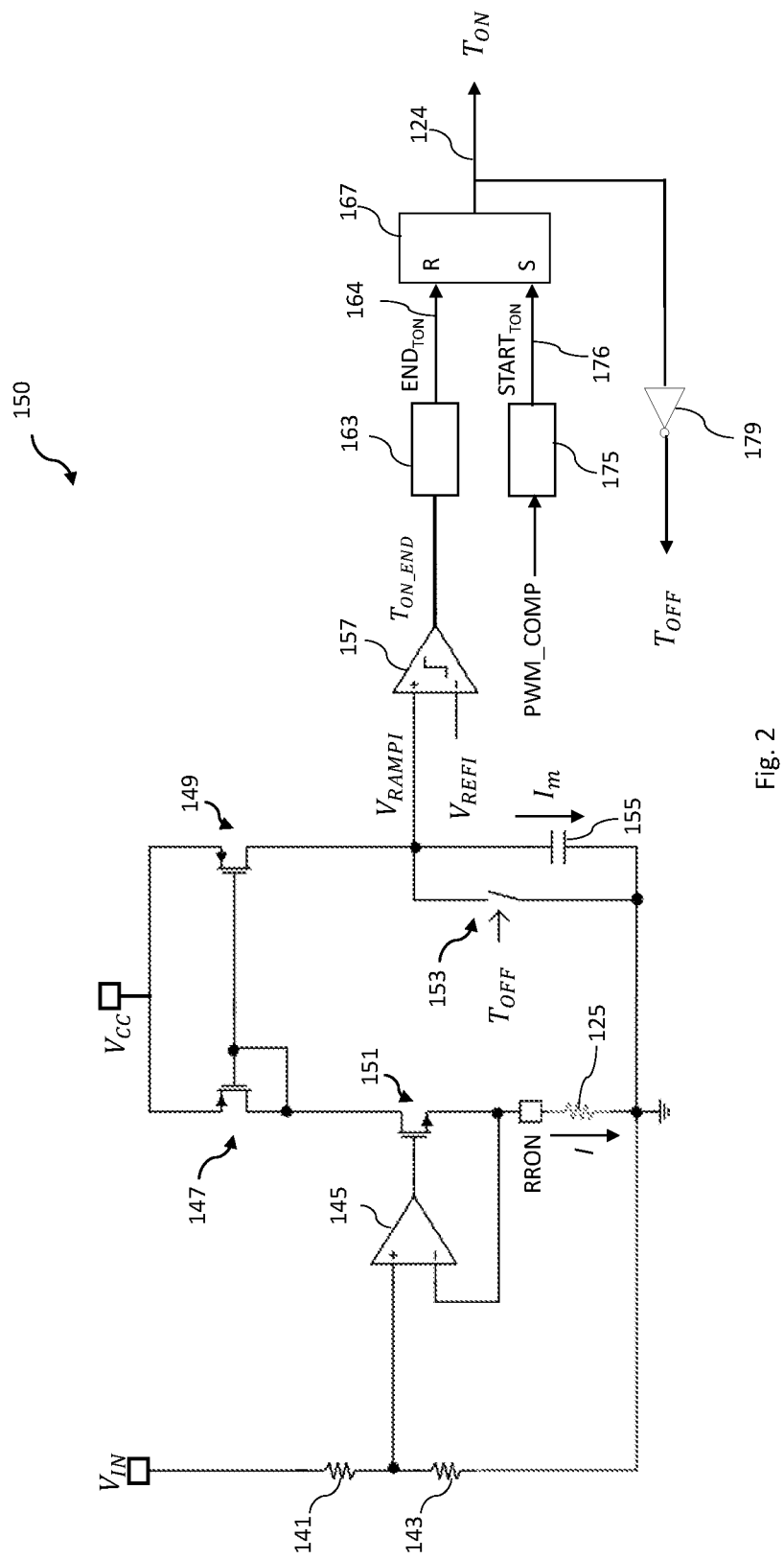
FIG. 2 illustrates a block diagram of a pulse generator, in an embodiment.

FIG. 2 illustrates a block diagram of a pulse generator 150, in an embodiment. The pulse generator 150 may be used as the pulse generator 123 of FIG. 1. Note that the resistor 125 coupled to the pin RRON of the IC device 110 in FIG. 1 is also illustrated in FIG. 2.

In FIG. 2, the pulse generator 150 includes an operational amplifier 145. A first input terminal (e.g., a non-inverting input terminal) of the operational amplifier 145 is coupled to an output of a voltage divider formed by resistors 141 and 143. The resistors 141 and 143 are coupled between the pin $V_{IN}$ and a reference voltage node (e.g., electrical ground). The voltage divider provides a scaled version of the voltage at the pin $V_{IN}$, denoted as $K_s \times V_{IN}$, to the first input terminal of the operational amplifier 145, where $K_s$ is a constant scaling factor.

A second input terminal (e.g., an inverting input terminal) of the operational amplifier 145 is coupled to the pin RRON. The voltage at the second input terminal of the operational amplifier 145, which is equal to the voltage at the first input terminal of the operational amplifier 145, generates a current $I = K_s \times V_{IN}/R_{RON}$ that flows through the resistor 125, where $R_{RON}$ is the resistance of the resistor 125. A mirror current $I_m$ is generated by the current mirror circuit (which includes transistors 147 and 149), and charges a capacitor 155 coupled to a non-inverting input terminal of a comparator 157.

A switch 153 is coupled in parallel to the capacitor 155, and is controlled by a control signal $T_{OFF}$. When the control signal $T_{OFF}$ is logic HIGH, the switch 153 is closed to discharge the capacitor 155 and resets the voltage across the capacitor 155 to zero. When the control signal $T_{OFF}$ is logic LOW, the switch 153 is open, and the mirror current $I_m$, charges the capacitor 155. As a result, the voltage across the capacitor 155, denoted as voltage $V_{RAMP1}$, increases linearly over time from zero. The comparator 157 compares the voltage $V_{RAMP1}$ with a reference voltage $V_{REF1}$ applied at an inverting input terminal of the comparator 157, and generates an output signal $T_{ON\_END}$. The reference voltage $V_{REF1}$ may be a constant reference voltage generated internally from other supply voltage within the IC device 110.

Still referring to FIG. 2, the output signal $T_{ON\_END}$ of the comparator 157 is sent to an edge detector 163. The edge detector 163 is configured to detect a rising edge in the output signal $T_{ON\_END}$ and generate an output signal 164 (e.g., a short pulse for each rising edge, also referred to as a $END_{TON}$ pulse) that starts at the rising edge of the output signal $T_{ON\_END}$. FIG. 2 also illustrates another edge detector 175. The edge detector 175 is configured to receive the PWM_COMP signal from the comparator 121 of FIG. 1, detect a rising edge in the PWM_COMP signal, and generate an output signal 176 (e.g., a short pulse for each rising edge, also referred to as a $START_{TON}$ pulse) that starts at the rising edge of the PWM_COMP signal. Each $START_{TON}$ pulse and a respective $END_{TON}$ pulse are used to generate a pulse signal, details are discussed below with reference to FIGS. 2 and 3.

In the example of FIG. 2, the output signal 176 (e.g., the $START_{TON}$ pulse) of the edge detector 175 is sent to a SET (S) terminal of a flip-flop 167, and the output signal 164 (e.g., the $END_{TON}$ pulse) of the edge detector 163 is sent to a RESET (R) terminal of the flip-flop 167. The flip-flop 167 may be, e.g., a Set-Reset (SR) latch that is formed by a pair of cross-coupled NOR gates. In some embodiments, the output (e.g., pulse signal 124) of the flip-flop 167 maintains its current value when the SET terminal and the RESET terminal are in the logic LOW state (e.g., signals at the SET and RESET terminals have the logic LOW value). If the SET terminal is pulsed high while the RESET terminal is held low, then the pulse signal 124 is forced high, and stays high when the SET terminal returns to low; similarly, if the RESET is pulsed high while the SET terminal is held low, then the pulse signal 124 is forced low, and stays low when the RESET terminal returns to low. The pulse signal 124 may also be referred to as a $T_{ON}$ signal, and the $T_{OFF}$ signal is generated by inverting the $T_{ON}$ signal using an inverter 179.

Figure 3:
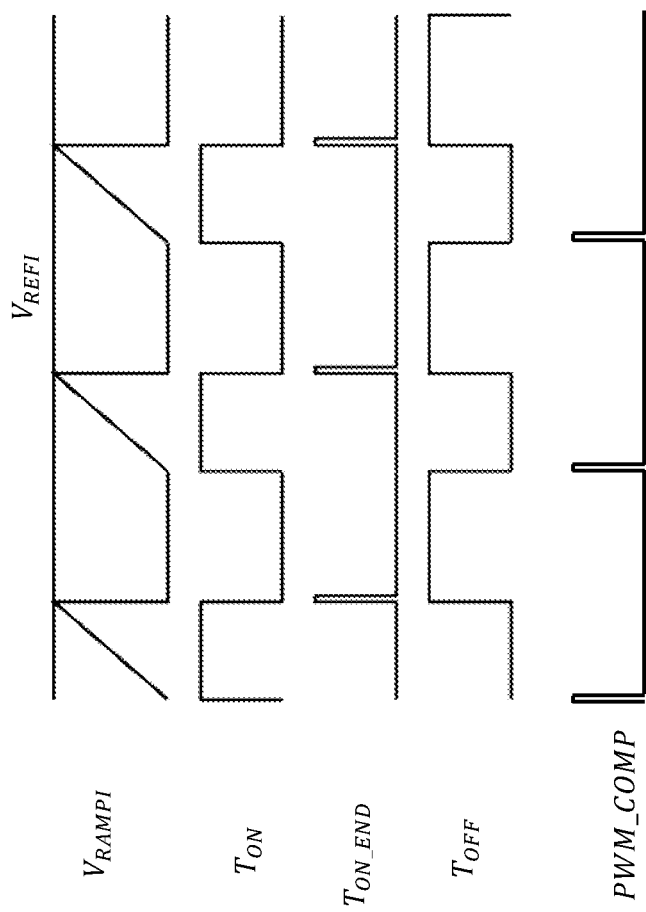
FIG. 3 illustrates a timing diagram for the pulse generator of FIG. 2, in an embodiment.

FIG. 3 illustrates a timing diagram for the pulse generator of FIG. 2, in an embodiment. As illustrated in FIG. 3, the pulse width of the $T_{ON}$ signal is determined by the time it takes for the voltage across the capacitor 155 in FIG. 2 to increase linearly from zero to the voltage $V_{REF1}$. In other words, how quickly the capacitor 155 is charged by the mirror current $I_m$ determines the pulse width of the $T_{ON}$ signal. One skilled in the art will readily appreciate that given the capacitance of the capacitor 155, the pulse width of the $T_{ON}$ signal is adjustable by adjusting the resistance $R_{RON}$ of the resistor 125. A larger resistance for the resistor 125 results in a smaller mirror current $I_m$ and a larger pulse width for the $T_{ON}$ signal, and conversely, a smaller resistance for the resistor 125 results in a larger mirror current $I_m$ and a smaller pulse width for the $T_{ON}$ signal, in some embodiments.

In order to achieve stability of the Buck converter, the control circuit for the Buck converter may need information regarding the output voltage of the Buck converter and/or the switching frequency of the Buck converter. The switching frequency of the Buck converter is the frequency at which the switch 109 is turned ON and OFF during operation, in some embodiments. The switching frequency of the Buck converter may be calculated as $$\frac{1}{P_{TON} + P_{TOFF}},$$

where $P_{TON}$ is the duration of a positive pulse in the $T_{ON}$ signal (see, e.g., FIG. 3), and $P_{TOFF}$ is the duration of a positive pulse in the $T_{OFF}$ signal (see, e.g., FIG. 3). However, the output voltage of the Buck converter and the switching frequency of the Buck converter may not be readily available for the control circuit. In addition, for the design of IC device 110, it is advantageous to keep the number of pins of the IC device 110 low to keep the design simple and cost effective. Therefore, it may be advantageous to design the control circuit that could receive combined information regarding the output voltage and switching frequency of the Buck converter using less pins. In some embodiments, the resistance $R_{RON}$ of the resistor 125 in FIG. 1 is given by:

$$R_{RON} = \frac{K_{RON} \times V_{OUT}}{f_{sw}} \quad (1)$$

where $V_{OUT}$ is the target output voltage of the Buck converter in unit of volt, $f_{SW}$ is the target switching frequency of the Buck converter in unit of kHz, $K_{RON}$ is a constant, and $R_{RON}$ is in unit of kΩ. In some embodiments, the resistance $R_{RON}$ is in a range between a few kilo-Ohms to a few hundred kilo-Ohms, and the constant $K_{RON}$ is defined to keep the resistance $R_{RON}$ within this range for all switching frequencies and output voltages within the design specification of the Buck converter. The resistance $R_{RON}$ in Equation (1) determines the pulse width of the $T_{ON}$ signal based on combined information regarding the output voltage and switching frequency of the Buck converter. The choice of resistance $R_{RON}$ of the resistor 125 in Equation (1) reduces the pin count of the IC device 110 while achieving improved stability for the Buck converter.

From the discussion above, skilled artisans will ready appreciate that among other factors, the compensation ramp voltage 120 generated by the ramp signal generator 119 to a large extent determines the switching behavior and performance of the Buck converter. In order to achieve good control of the Buck converter, the compensation ramp voltage 120 should have a large enough amplitude to avoid jitter due to the precision of the comparator 121. In addition, the gradient (also referred to as slope) of the compensation ramp voltage 120 should be in a specific range. In particular, the inventors of this application have found that, given a target output voltage ripple $\Delta V_{OUT}$ (e.g., ripple in the output voltage $V_{OUT}$) of the Buck converter and a target switching frequency $f_x$ of the Buck converter, a gradient $S_x$ (also referred to as a slope) of the compensation ramp voltage 120 is given by:

$$S_x > K \times f_x \times \Delta V_{OUT} \quad (2)$$

where K is a multiplication factor have a value between about 1.5 and about 5. The value of K may be found by, e.g., performing simulation and analysis of the Buck converter. In the discussion herein, the inverse of the switching frequency (e.g., $1/f_x$) is referred to as the switching period of the Buck converter. In the illustrate embodiments, the output voltage ripple $\Delta V_{OUT}$ is the same as the feedback voltage ripple $\Delta V_{FB}$ (e.g., ripple in the feedback voltage 136) of the Buck converter, thanks to the feedforward capacitor $C_{FF}$. In other words, $\Delta V_{OUT} = \Delta V_{FB}$ in the illustrated embodiments.

As shown in Equation (2), the needed slope value for the compensation ramp voltage 120 scales with the switching frequency $f_x$ proportionally. However, the switching frequency $f_x$ is not known in the control circuit of FIG. 1. The solution to this challenge is to use a closed-loop system that tracks (e.g., measures) the switching frequency of the Buck converter, and generate the compensation ramp voltage 120 as a linear voltage with a constant slope, wherein the constant slop is proportional to the switching frequency of the Buck converter.

Figure 4:
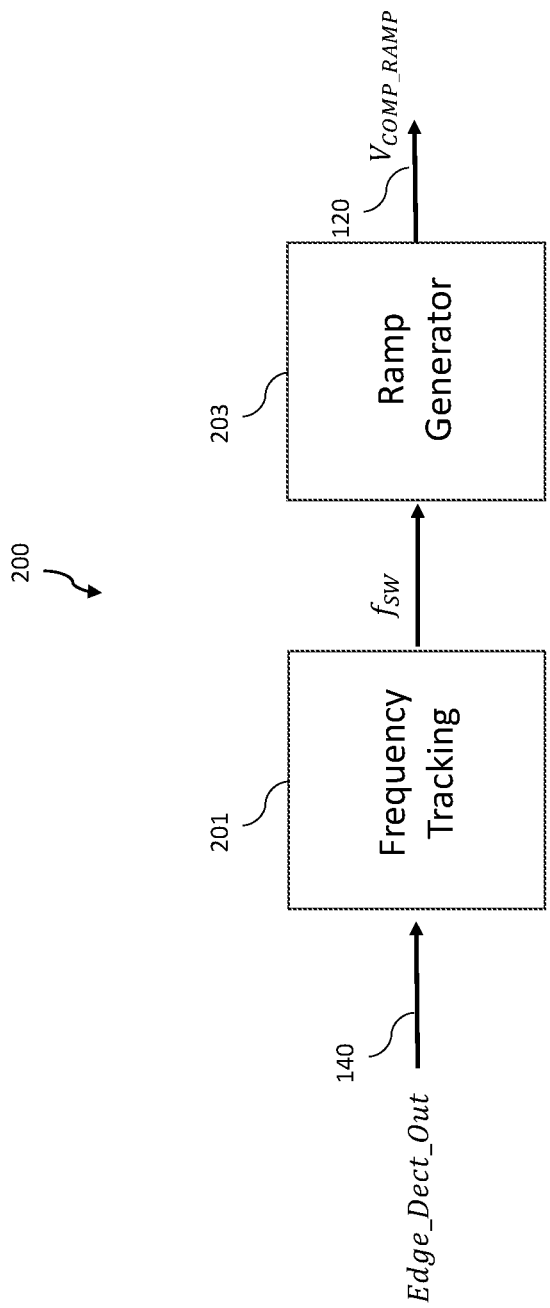
FIG. 4 illustrates a block diagram of a ramp signal generator, in an embodiment.

FIG. 4 illustrates a block diagram of a ramp signal generator 200, in an embodiment. The ram signal generator 200 may be used as the ramp signal generator 119 in FIG. 1. FIG. 4 shows a high-level, generic block diagram for the ramp signal generator 200. Different embodiments of the ramp signal generator 200 in FIG. 4 are discussed hereinafter with reference to FIGS. 7-9.

In FIG. 4, the ramp signal generator 200 includes a frequency tracking circuit 201 and a ramp generator 203. The frequency tracking circuit 201 receives an input signal indicative of the switching frequency of the Buck converter, such as the control signal 140 (also referred to as the Edge_Dect_Out signal) generated by the edge detector 139. Besides the control signal 140, other signals, such as the output signal 122 (also referred to as the PWM_COMP signal) of the PWM comparator 121, or the pulse signal 124 (also referred to as the $T_{ON}$ signal) generated by the pulse generator 123, may also be used. Based on the input signal (e.g., control signal 140), the frequency tracking circuit 201 tracks (e.g., measures, or estimates) the switching frequency of the Buck converter, and send the estimated switching frequency $f_{SW}$ to the ramp generator 203. The ramp generator 203 then generates a linear ramp voltage $V_{RAMP}$ with a gradient proportional to the estimated switching frequency $f_{SW}$, adds the linear ramp voltage $V_{RAMP}$ to the voltage COMP at the output terminal 114 of the transconductance amplifier 113 to generate the compensation ramp voltage 120 (also referred to as a $V_{COMP\_RAMP}$ signal).

Figure 5B:
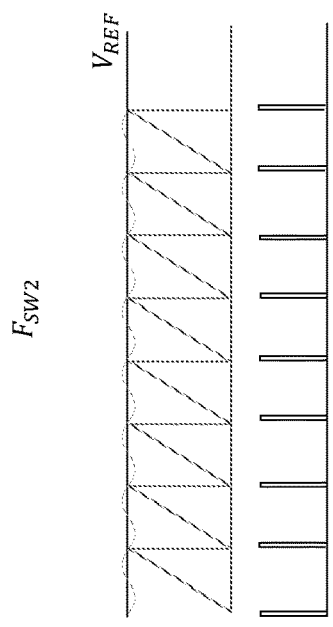
FIGS. 5A and 5B illustrate timing diagrams of the Constant On-Time (COT) Buck converter of FIG. 1 at two different switching frequencies, in an embodiment.
Figure 5A:
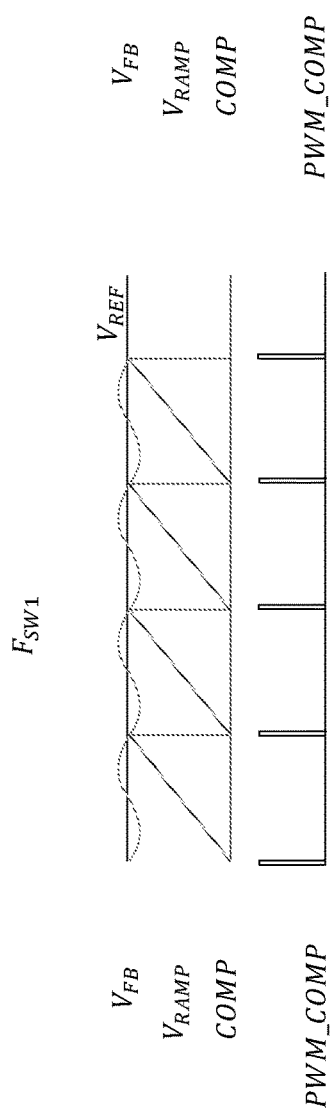

FIGS. 5A and 5B illustrate timing diagrams of the Constant On-Time (COT) Buck converter of FIG. 1 at two different switching frequencies, in an embodiment. FIG. 5A shows the Buck converter switching at a low switching frequency $F_{SW1}$, and FIG. 5B shows the Buck converter switching at a higher switching frequency $F_{SW2}$.

In FIG. 5A, the voltage COMP is illustrated as a constant voltage. In some embodiments, during steady state operation of the Buck converter, the voltage COMP at the output terminal 114 in FIG. 1 is quasi-static (e.g., changing very slowly), such that in tens of, hundreds of, or more switching periods of the Buck converter, the voltage COMP can be treated as if it has a constant value. In some embodiments, the voltage COMP has a quasi-static value of zero in steady state of the Buck converter.

Still referring to FIG. 5A, the ramp voltage $V_{RAMP}$ is generated by the ramp signal generator 119 (see FIG. 1) and added on top of the voltage COMP to form the compensation ramp voltage 120. For ease of discussion, the voltage COMP may be considered as zero, so the ramp voltage $V_{RAMP}$ is considered the same as the compensation ramp voltage 120. The sine wave shaped curve in FIG. 5A illustrates the feedback voltage $V_{FB}$, which oscillates around the constant reference voltage $V_{REF}$. Note that the feedback voltage $V_{FB}$ is illustrated as a sine wave shaped curve for illustration purpose only, the actual shape of the feedback voltage $V_{FB}$ may not be a sine wave. Referring to FIG. 5A and FIG. 1, when the rising ramp voltage $V_{RAMP}$ reaches a same value as the feedback voltage $V_{FB}$, the PWM_COMP signal at the output of the comparator 121 turns to logic HIGH. In response to the rising edge of the PWM_COMP signal, the pulse generator 123 generates a pulse in the $T_{ON}$ signal (e.g., pulse signal 124). The $T_{ON}$ signal is used by the logic circuit 127 to generate the switching control signals 128A and 128B for switching the switches 109 and 131 of the Buck converter. A rising edge in the switching control signal 128A is detected by the edge detector 139 to generate a narrow pulse in the control signal 140. As will be discussed in more details, the narrow pulse in the control signal 140 resets the ramp voltage $V_{RAMP}$ to zero. As a result, the PWM_COMP signal turns logic LOW shortly after turning logic HIGH, and the ramp voltage $V_{RAMP}$ starts to increase from zero again, and the process discussed above repeats again.

FIG. 5B is similar to FIG. 5A, but the Buck converter switches at a higher switching frequency. As illustrated in FIG. 5B, due to the higher switching frequency, the ramp voltage $V_{RAMP}$ generated by the ramp signal generator 119 has a higher gradient. Notably, in FIGS. 5A and 5B, at the end of each switching period (which is equivalent to the duration for the ramp voltage $V_{RAMP}$ to increase from zero to its maximum value), the ramp voltage $V_{RAMP}$ has a same final value. In other words, regardless of the switching frequency of the Buck converter, the final value of the ramp voltage $V_{RAMP}$ at the end of each switching period has a same fixed value.

FIG. 6 illustrates the gradient of the compensation ramp voltage at different switching frequencies of the Buck converter, in an embodiment. In the discussion herein, the gradient of the compensation ramp voltage 120 and the gradient of the ramp voltage $V_{RAMP}$ are considered as the same. The first column shows the switching frequencies, and the second column shows the corresponding switching periods. The third column shows the slope $S_x$ of the compensation ramp voltage at the corresponding switching frequency. The fourth column shows the equivalent ramp amplitude for each switching frequency, where the equivalent ramp amplitude is the final value of the compensation ramp voltage 120 at the end of each switching period. Notably, the example in FIG. 5, the equivalent ramp amplitudes for all switching frequencies have the same value.

Figure 7:
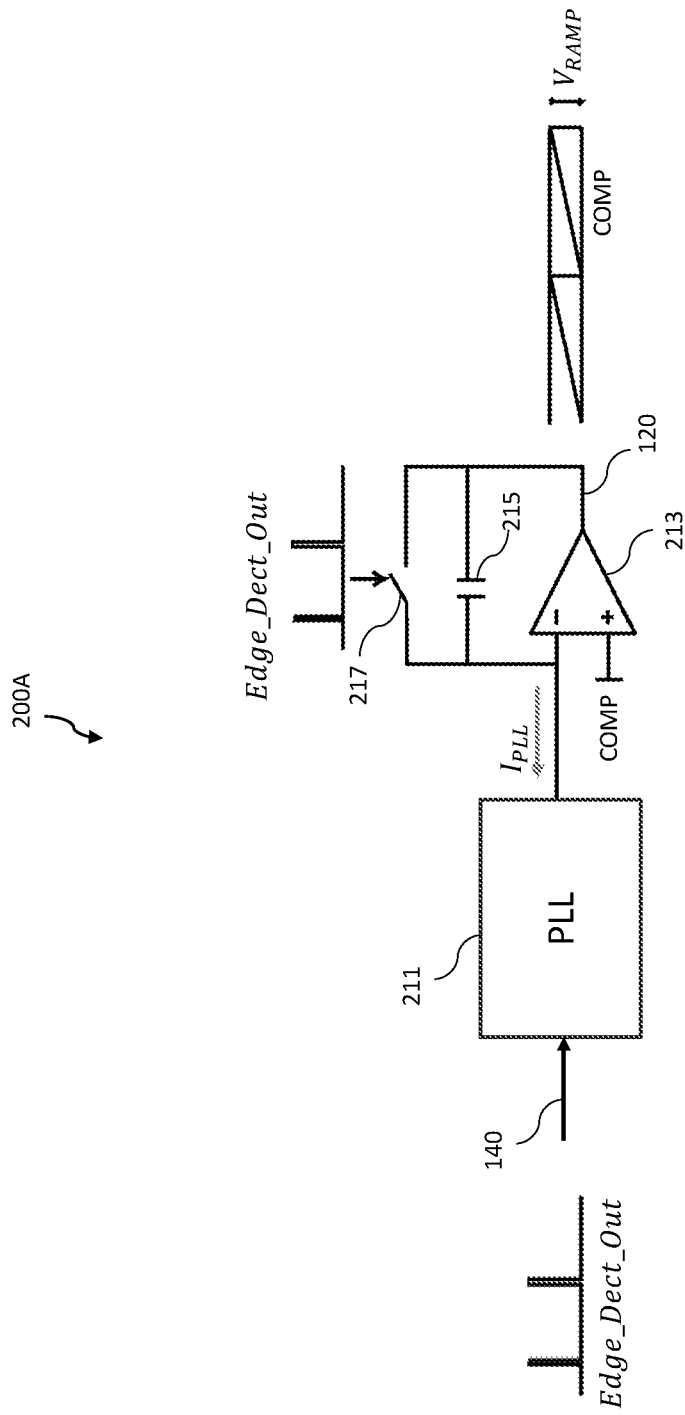
FIG. 7 illustrates a block diagram of a ramp signal generator having a phase-locked loop (PLL), in an embodiment.
Figure 8:
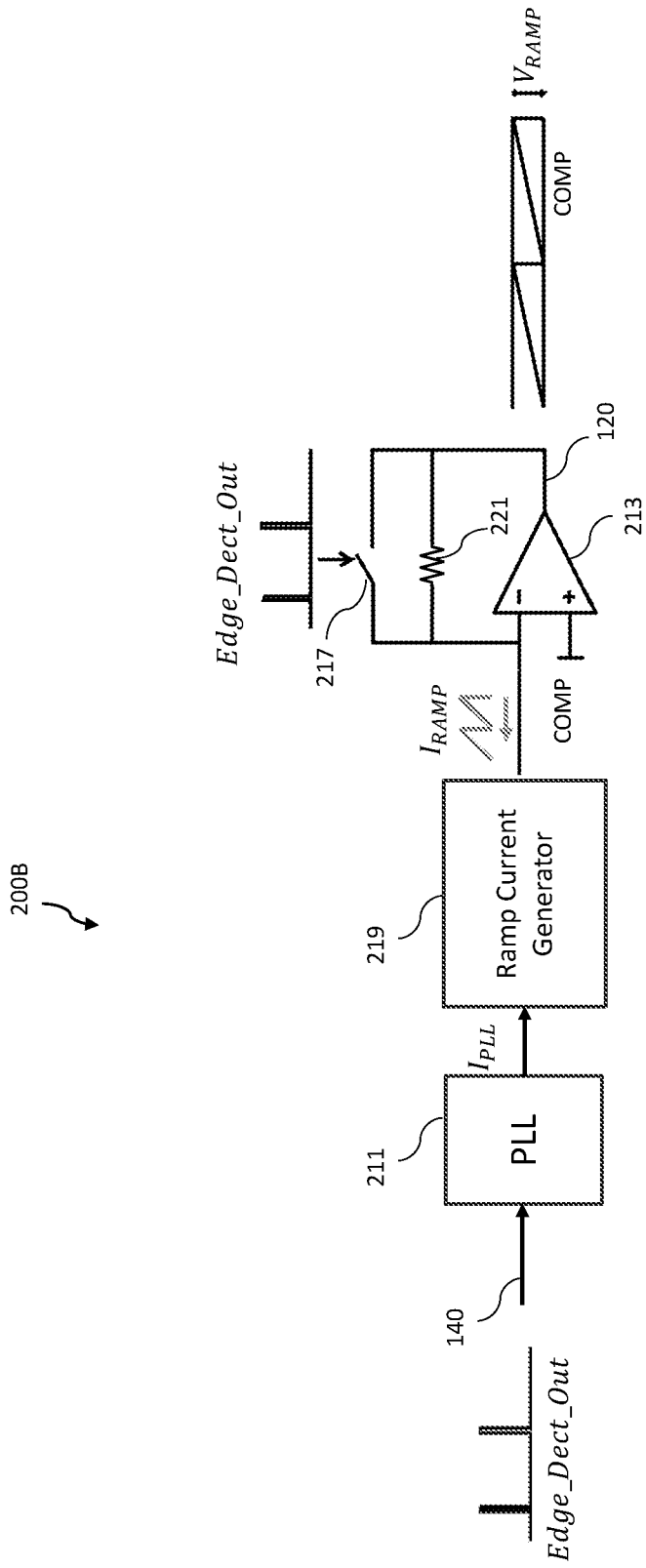
FIG. 8 illustrates a block diagram of a ramp signal generator having a phase-locked loop (PLL), in another embodiment.
Figure 9:
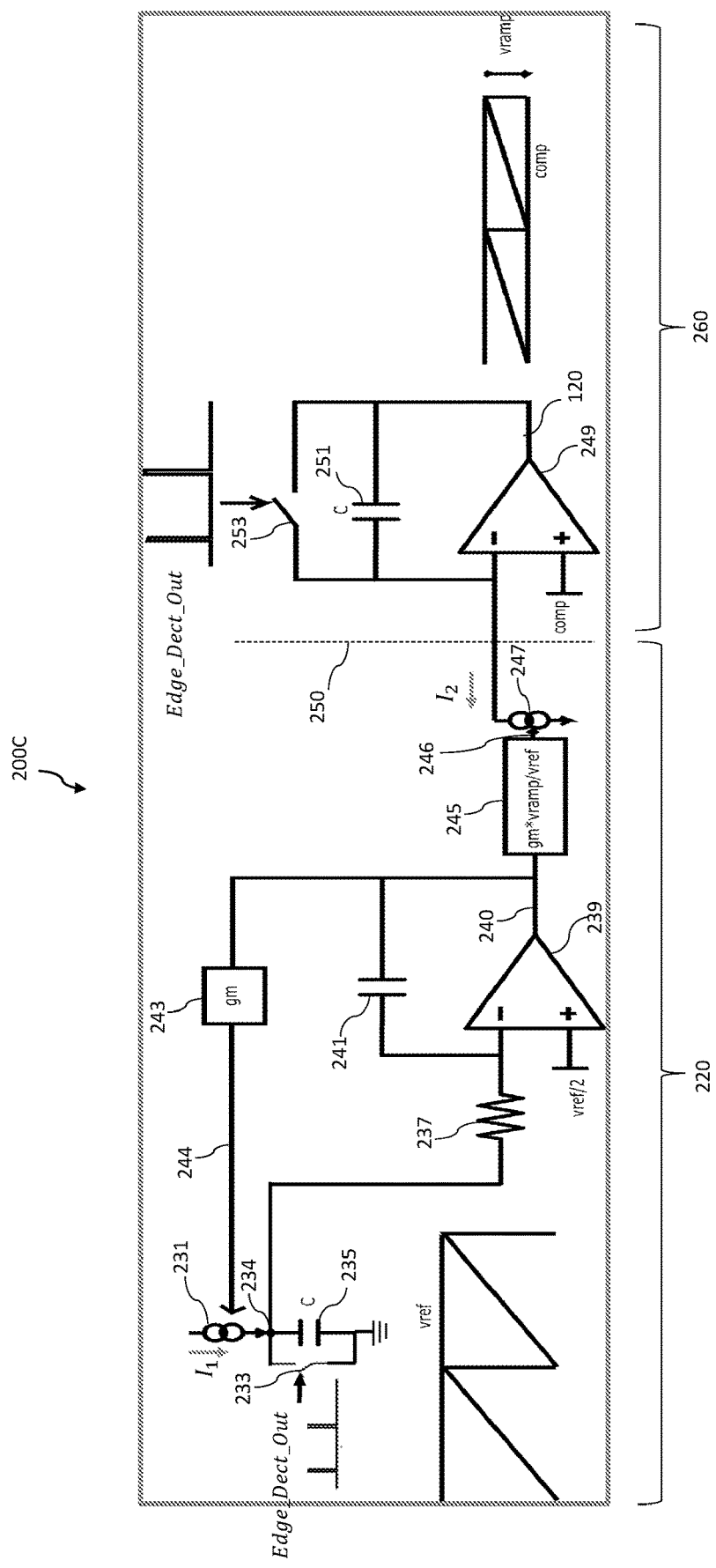
FIG. 9 illustrates a block diagram of a ramp signal generator having a closed-loop controlled integrator circuit, in an embodiment.

FIG. 7 illustrates a block diagram of a ramp signal generator 200A having a phase-locked loop (PLL), in an embodiment. The ramp signal generator 200A includes a PLL circuit 211 that tracks (e.g., measures, estimates) the switching frequency of the Buck converter based on an input signal indicative of the switching frequency of the Buck converter. In the embodiments of FIGS. 7-9, the control signal 140 generated by the edge detector 139 is used as the input signal as a non-limiting example. Besides the control signal 140, other signals, such as the output signal 122 of the PWM comparator 121, or the pulse signal 124 generated by the pulse generator 123, may also be used. PLL circuits for tracking frequency is known and used in the art, thus details are not discussed here. In the example of FIG. 7, the PLL circuit 211 is configured to generate an output current $I_{PLL}$, where the value of the output current $I_{PLL}$ is proportional to the estimated frequency of the Buck converter.

The ramp signal generator 200A also includes an operational amplifier 213. A non-inverting input terminal of the operational amplifier 213 is configured to be coupled to the output terminal 114 of the transconductance amplifier 113, thus supplied with the voltage COMP. A inverting input terminal of the operational amplifier 213 is coupled to the output terminal of the PLL circuit 211. A capacitor 215 is coupled between the inverting input terminal of the operational amplifier 213 and an output terminal of the operational amplifier 213. A switch 217 (e.g., a transistor or the like), which is controlled by, e.g., the control signal 140 (the Edge_Dect_Out signal), is coupled in parallel to the capacitor 215.

At the beginning of a switching period of the Buck converter, the short pulse in the Edge_Dect_Out signal closes the switch 217 for a short period of time to discharge the capacitor 215 and resets the voltage across the capacitor 215 to zero. The switch 217 is then open, allowing the output current $I_{PLL}$ to charge the capacitor 215. The voltage across the capacitor 215, which is the ramp voltage $V_{RAMP}$, increases linearly over time. The gradient of the ramp voltage $V_{RAMP}$ is determined by the output current $I_{PLL}$, thus is proportional to the switching frequency of the Buck converter. The direction of the output current $I_{PLL}$ is illustrated in FIG. 7, and therefore, the voltage 120 at the output terminal of the operational amplifier 213 is the ramp voltage $V_{RAMP}$ added on top of the voltage COMP, which voltage 120 is the compensation ramp voltage 120.

FIG. 8 illustrates a block diagram of a ramp signal generator 200B having a phase-locked loop (PLL), in another embodiment. The ramp signal generator 200B is similar to the ramp signal generator 200A, but with a ramp current generator 219 coupled between the PLL circuit 211 and the inverting input terminal of the operational amplifier 213, and with a resistor 221 replacing the capacitor 215 in FIG. 7.

In FIG. 8, the output current $I_{PLL}$ generated by the PLL circuit 211, which is proportional to the switching frequency of the Buck converter, is sent to the ramp current generator 219. The ramp current generator 219 is configured to generate a ramp current $I_{RAMP}$ that increases linearly from zero to a final value in a switching period of the Buck converter. The gradient of the ramp current $I_{RAMP}$ is proportional to the switching frequency of the Buck converter. The ramp current $I_{RAMP}$ flows through the resistor 221 to generate the ramp voltage $V_{RAMP}$. Other details are same as or similar to those of FIG. 7, thus not repeated here.

FIG. 9 illustrates a block diagram of a ramp signal generator 200C having a closed-loop controlled integrator circuit, in an embodiment. The ramp signal generator 200C comprises two circuits disposed on opposing sides of the dashed line 250: a current generation circuit 220 and a voltage generation circuit 260. The current generation circuit 220 is configured to generate a current $I_2$ that is proportional to the switching frequency of the Buck converter at steady state of the Buck converter. The voltage generation circuit 260 is configured to generate the compensation ramp voltage 120 based on the current $I_2$. Details are discussed hereinafter.

The current generation circuit 220 includes a current source 231, which is an adjustable current source for generating a current $I_1$ based on an adjustment signal 244. In some embodiments, the current $I_1$ generated is proportional to the adjustment signal 244. A capacitor 235 is coupled between the current source 231 and a reference node (e.g., electrical ground). A switch 233 is coupled in parallel to the capacitor 235, and is controlled by, e.g., the control signal 140 generated by the edge detector 139. The switch 233 is closed when the control signal 140 is logic HIGH, and is open when the control signal 140 is logic LOW.

Still referring to FIG. 9, a resistor 237 is coupled between an inverting input terminal of an operational amplifier 239 and a node 234 between the current source 231 and the capacitor 235. A non-inverting input terminal of the operational amplifier 239 is supplied with a voltage that is half of the reference voltage $V_{REF}$. A capacitor 241 is coupled between the inverting input terminal of the operational amplifier 239 and an output terminal of the operational amplifier 239.

The current generation circuit 220 further includes a gain circuit 243 that generates the adjustment signal 244 based on a voltage 240 at the output terminal of the operational amplifier 239. The gain factor of the gain circuit 243 is denoted as gm and may also be referred to as a transconductance gain. For example, the adjustment signal 244 may be obtained by multiplying the value of the voltage signal 240 with the gain factor gm. The current $I_1$ produced by the current source 231 is effectively controlled by the voltage 240, and therefore, the current source 231 may be considered as a voltage-controlled current source (VCCS). In some embodiments, the current source 231 and the gain circuit 220 may be implemented together as a voltage-controlled current source, such as a transconductance amplifier with a transconductance gain of gm.

The current generation circuit 220 further includes a current source 247, which is an adjustable current source that generates the current $I_2$ based on an adjustment signal 246 generated by a gain circuit 245. In some embodiments, the current $I_2$ generated by the current source 247 is proportional to the adjustment signal 246. In some embodiments, the current source 247 and the current source 231 generate the same output current value if their adjustment signals are the same. The gain circuit 245 has a gain factor of $$gm \times \frac{V_{RAMP}}{V_{REF}}.$$

Note that for ease of discussion, $V_{RAMP}$ is used herein to also represent the final value (e.g., maximum value) of the ramp voltage $V_{RAMP}$ in a switching period, and $V_{REF}$ is used herein to also represent the value of the reference voltage $V_{REF}$. In some embodiments, the adjustment signal 246 may be obtained by multiplying the value of the voltage signal 240 with the gain factor $gm \times V_{RAMP}/V_{REF}$. The current $I_2$ produced by the current source 247 is effectively controlled by the voltage 240, and therefore, the current source 247 may be considered as a voltage-controlled current source (VCCS). In some embodiments, the current source 247 and the gain circuit 245 may be implemented together as a voltage-controlled current source, such as a transconductance amplifier with a transconductance gain of $gm \times V_{RAMP}/V_{REF}$.

The gain circuit 243 functions as a feedback path to form a closed-loop control system such that during steady state of the Buck converter, the voltage 240 is at a target value (e.g., $V_{REF}/2$), or equivalently, the voltage across the capacitor 235 at the end of each switching period is equal to a target value of $V_{REF}$. As discussed below in detail, to achieve the target value of $V_{REF}$, the value of the current $I_1$ is adjusted in accordance with the switching frequency of the Buck converter.

At the beginning of each switching period, the switch 233 is closed for a short period of time to reset the voltage across the capacitor 235 to zero. Then, the switch 233 is open, and the current $I_1$ charges the capacitor 235, and as a result, the voltage across the capacitor 235 increases linearly during the switching period. The voltage difference across the resistor 237, which is the different between the voltage $V_{REF}/2$ and the voltage across the capacitor 235, generates a current flowing through the resistor 237 and the capacitor 241. In the illustrated embodiment, the capacitor 241 forms a low-bandwidth filter, so that the voltage 240 at the output terminal of the operational amplifier 239 has a substantially constant value.

One skilled in the art will readily appreciate that, given the switching frequency of the Buck converter and the capacitance of the capacitor 235, the value of the current $I_1$ determines the final value reached at the end of a switching period by the linearly increasing voltage across the capacitor 235. If the final value of the voltage across the capacitor 235 is lower or higher than the target value $V_{REF}$, the voltage 240 is off from its target value (e.g., $V_{REF}/2$). The feedback control loop will adjust (e.g., increase or decrease) the current $I_1$, such that the final value of the voltage across the capacitor 235 is at the target value. In other words, the feedback control loop ensures that the current $I_1$ is proportional to the switching frequency of the Buck converter, and that charging the capacitor 235 with the current $I_1$ results in a linear voltage with a final value of $V_{REF}$ at the end of a switching period of the Buck converter.

Still referring to FIG. 9, the voltage generation circuit 260 includes an operational amplifier 249. An inverting input terminal of the operational amplifier 249 is coupled to the current source 247, and a non-inverting input terminal of the operational amplifier 249 is coupled to the output terminal 114 of the transconductance amplifier 113 (see FIG. 1), thus configured to be supplied with the voltage COMP. A capacitor 251 is coupled between the non-inverting input terminal of the operational amplifier 249 and the output terminal of the operational amplifier 249. A switch 253 is coupled in parallel to the capacitor 251, and is controlled in the same or similar way as the switch 233, e.g., by the control signal 140. Notably, the capacitor 251 and the capacitor 235 have a same capacitance C. The capacitance matching between the capacitor 251 and the capacitor 235 ensures that the ramp voltage $V_{RAMP}$ across the capacitor 251 is at the target value of $V_{RAMP}$ at the end of a switching period, as discussed below.

Since the ratio between the gain factor of the gain circuit 245 and the gain factor of the gain circuit 243 is $V_{RAMP}/V_{REF}$, the current $I_2$ generated by the current source 247 is scaled by a factor of $V_{RAMP}/V_{REF}$ compared with the current $I_1$. Therefore, when current $I_2$ is used to charge the capacitor 251 (which has the same capacitance C as the capacitor 235), the final value of the ramp voltage across the capacitor 251 is $$\frac{V_{REF} \times V_{RAMP}}{V_{REF}} = V_{RAMP}.$$

In other words, the final value of the ramp voltage achieved at the end of a switching period is $V_{RAMP}$. The voltage 120 at the output terminal of the operational amplifier 249 is the compensation ramp voltage 120, which is equal to the ramp voltage $V_{RAMP}$ added on top of the voltage COMP.

Figure 10:
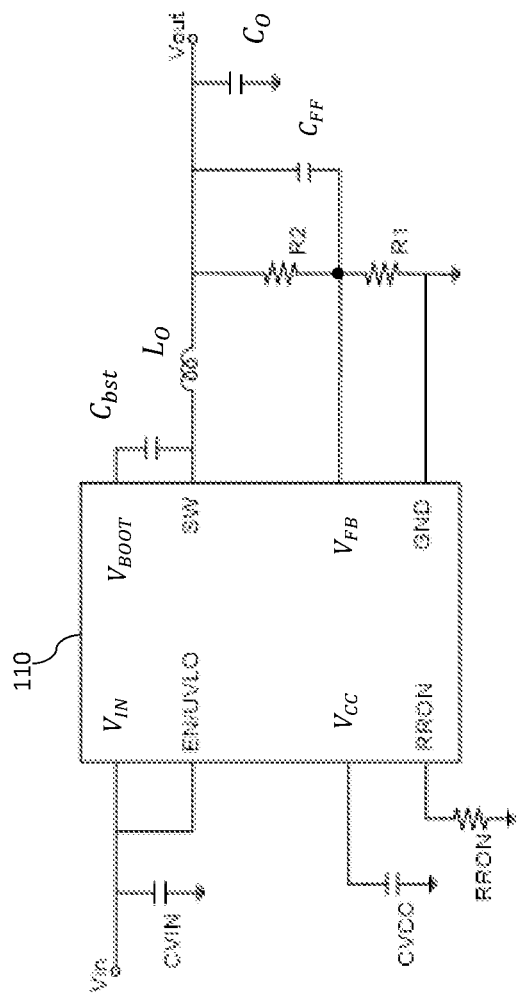
FIG. 10 illustrates the pins of the integrated circuit (IC) device of FIG. 1, in an embodiment.

FIG. 10 illustrates the pins of the integrated circuit (IC) device 110 of FIG. 1, in an embodiment. As illustrated in FIG. 10, the number of pins used for the IC device 110 is very small, e.g., only 8 pins, which reduces the cost of manufacturing and the cost of deploying the IC device 110 in the field. The pins in FIG. 10 match the pins shown in FIG. 1 by the pin names. Note that FIG. 10 illustrates an extra pin (e.g., the enable pin EN/UVLO) than FIG. 1, which enable pin EN/UVLO is used for enabling or disabling the IC device 110. The number of external components needed for the IC device 110 is also very limited, as illustrated in FIG. 10. Two capacitors CVIN and CVCC are used to filter out high frequency component of the supply voltage at pins $V_{in}$ and $V_{cc}$. Other external components are discussed in FIG. 1, thus not discussed here.

Figure 11:
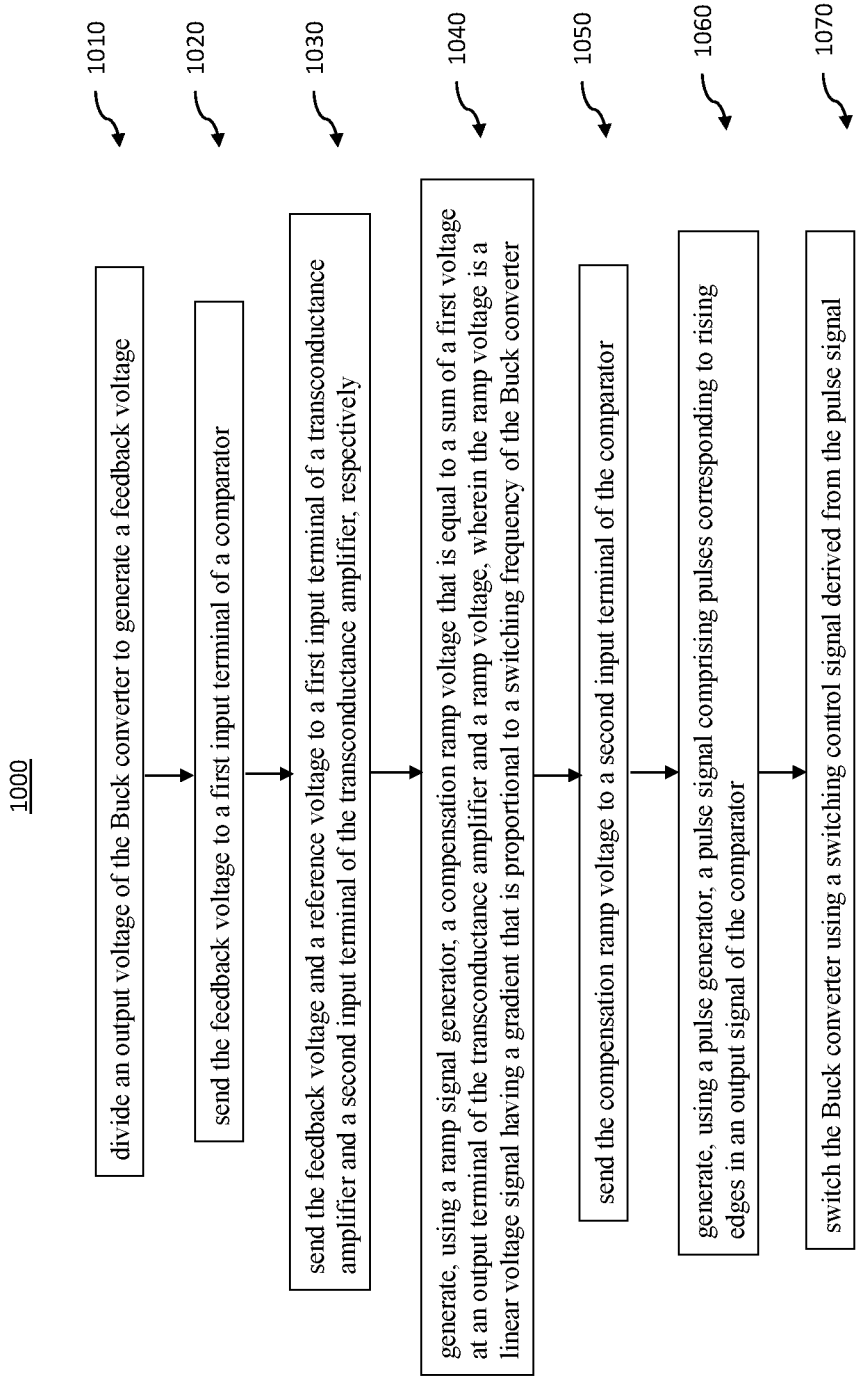
FIG. 11 illustrates a flow chart of a method of operating a Buck converter, in some embodiments.

FIG. 11 illustrates a flow chart of a method 1000 of operating a Buck converter, in some embodiments. It should be understood that the example method shown in FIG. 11 is merely an example of many possible example methods. One of ordinary skill in the art would recognize many variations, alternatives, and modifications. For example, various steps as illustrated in FIG. 11 may be added, removed, replaced, rearranged, or repeated.

Referring to FIG. 11, at block 1010, an output voltage of the Buck converter is divided to generate a feedback voltage. At block 1020, the feedback voltage is sent to a first input terminal of a comparator. At block 1030, the feedback voltage and a reference voltage are sent to a first input terminal of a transconductance amplifier and a second input terminal of the transconductance amplifier, respectively. At block 1040, a ramp signal generator generates a compensation ramp voltage that is equal to a sum of a first voltage at an output terminal of the transconductance amplifier and a ramp voltage, wherein the ramp voltage is a linear voltage signal having a gradient that is proportional to a switching frequency of the Buck converter. At block 1050, the compensation ramp voltage is sent to a second input terminal of the comparator. At block 1060, a pulse generator generates a pulse signal comprising pulses corresponding to rising edges in an output signal of the comparator. At block 1070, the Buck converter is switched under control of a switching control signal derived from the pulse signal.

Embodiments may achieve advantages as described below. For example, the disclosed control circuit for the COT Buck converter does not require that direct information of the output voltage and switching frequency being input from pins of the IC device no, thereby reducing the number of pins needed for the IC device no. A combination of the output voltage and switching frequency is supplied to the pin RRON of the IC device no to determine the pulse width of the $T_{ON}$ signal. In the feedback path, besides the voltage divider, only a non-dissipative capacitor $C_{FF}$ (which is optional) is used, which reduces power consumption and improves the power efficiency of the Buck converter. In addition, the control circuit of the Buck converter performs stability control by using a PLL circuit for generating an output signal (e.g., a current signal) that is proportional to the switching frequency of the Buck converter, then generating the compensation ramp voltage having a gradient proportional to the output signal. The compensation ramp voltage generated by the disclosed ramp signal generators achieves stability of the Buck converter over a wide range of output voltage ripple and switching frequency.

Examples of the present invention are summarized here. Other examples can also be understood from the entirety of the specification and the claims filed herein.

Example 1. In accordance with an embodiment, a switched-mode power supply (SMPS) includes: a Buck converter; and a control circuit for the Buck converter, comprising: a comparator configured to compare a feedback voltage of the Buck converter with a compensation ramp voltage; a pulse generator coupled to an output terminal of the comparator and configured to generate a pulse signal in response to a rising edge in an output signal of the comparator, wherein switching of the Buck converter is controlled by the pulse signal; a transconductance amplifier, wherein a first input terminal of the transconductance amplifier is configured to receive the feedback voltage, and a second input terminal of the transconductance amplifier is configured to receive a reference voltage; a first capacitor coupled between an output terminal of the transconductance amplifier and a reference voltage node; and a ramp signal generator configured to generate a ramp voltage and add the ramp voltage to a first voltage at the output terminal of the transconductance amplifier to generate the compensation ramp voltage, wherein the ramp voltage is a linear voltage signal, and the ramp signal generator is configured to adjust a gradient of the linear voltage signal in accordance with a switching frequency of the Buck converter.

Example 2. The SMPS of Example 1, wherein the ramp signal generator is configured to adjust the gradient of the linear voltage signal to be proportional to the switching frequency of the Buck converter.

Example 3. The SMPS of Example 2, wherein in a steady state of the Buck converter, a value of the ramp voltage at an end of a switching period of the Buck converter has a fixed value, wherein the fixed value is independent of the switching frequency of the Buck converter.

Example 4. The SMPS of Example 3, further comprising: a logic circuit configured to derive, from the pulse signal, a switching control signal for the Buck converter, wherein the switching control signal controls switching of one or more switches of the Buck converter; and an edge detector configured to generate a control signal for the ramp signal generator by detecting a rising edge in the switching control signal.

Example 5. The SMPS of Example 3, wherein the pulse signal has a fixed pulse width.

Example 6. The SMPS of Example 3, wherein a gradient of the linear voltage signal is equal to or larger than $S_x$, where $S_x = K \times f_{swx} \times \Delta V_{out}$, $\Delta V_{out}$ is the Buck converter's output voltage ripple, $f_{swx}$, is the switching frequency of the Buck converter, and K is a constant value.

Example 7. The SMPS of Example 1, further comprising: a voltage divider coupled between an output terminal of the Buck converter and the reference voltage node, wherein the voltage divider comprising a first resistor and a second resistor coupled in series; and a feed-forward capacitor coupled between the output terminal of the Buck converter and a node between the first resistor and the second resistor.

Example 8. The SMPS of Example 1, wherein the ramp signal generator comprises: a phase-locked loop (PLL) configured to track the switching frequency of the Buck converter and generate an output current signal proportional to the switching frequency of the Buck converter; an operational amplifier, wherein a non-inverting input terminal of the operational amplifier is coupled to the output terminal of the transconductance amplifier, and an inverting input terminal of the operational amplifier is coupled to an output terminal of the PLL; a second capacitor coupled between the inverting input terminal of the operational amplifier and an output terminal of the operational amplifier; and a switch coupled in parallel to the second capacitor, wherein the switch is configured to be closed for a period of time at a beginning of a switching period of the Buck converter.

Example 9. The SMPS of Example 1, wherein the ramp signal generator comprises: a phase-locked loop (PLL) configured to track the switching frequency of the Buck converter and generate a first current signal proportional to the switching frequency of the Buck converter; a ramp current generator configured to generate a second current signal that increases linearly in a switching period of the Buck converter, wherein a gradient of the second current signal is proportional to a value of the first current signal; an operational amplifier, wherein a non-inverting input terminal of the operational amplifier is coupled to the output terminal of the transconductance amplifier, and an inverting input terminal of the operational amplifier is coupled to an output terminal of the ramp current generator; a resistor coupled between the inverting input terminal of the operational amplifier and an output terminal of the operational amplifier; and a switch coupled in parallel to the resistor, wherein the switch is configured to be closed for a period of time at a beginning of the switching period of the Buck converter.

Example 10. The SMPS of Example 1, wherein the ramp signal generator comprises: a first adjustable current source, wherein the first adjustable current source is configured to be controlled by a first adjustment signal and to generate a first supply current proportional to the switching frequency of the Buck converter; a first operational amplifier, wherein a non-inverting input terminal of the first operational amplifier is coupled to the output terminal of the transconductance amplifier, and an inverting input terminal of the first operational amplifier is coupled to the first adjustable current source; a second capacitor coupled between the inverting input terminal of the first operational amplifier and an output terminal of the first operational amplifier; and a first switch coupled in parallel to the second capacitor, wherein the first switch is configured to be closed for a period of time at a beginning of a switching period of the Buck converter.

Example 11. The SMPS of Example 10, wherein the ramp signal generator further comprises: a second adjustable current source, wherein the second adjustable current source is configured to be controlled by a second adjustment signal and to generate a second supply current; a third capacitor coupled between the second adjustable current source and the reference voltage node; a second switch coupled in parallel to the third capacitor, wherein the second switch and the first switch are controlled by a same control signal; a second operational amplifier, wherein a non-inverting input terminal of the second operational amplifier is configured to receive a voltage equal to half of the reference voltage; a resistor coupled between an inverting input terminal of the second operational amplifier and a node between the second adjustable current source and the third capacitor; a fourth capacitor coupled between the inverting input terminal of the second operational amplifier and an output terminal of the second operational amplifier; a first gain circuit coupled to the output terminal of the second operational amplifier and configured to generate the first adjustment signal; and a second gain circuit coupled to the output terminal of the second operational amplifier and configured to generate the second adjustment signal.

Example 12. The SMPS of Example 11, wherein the second capacitor and the third capacitor has a same capacitance, wherein the second gain circuit has a transconductance gain $G_m$, and the first gain circuit has a transconductance gain $G_m \times V_{RAMP} \times V_{REF}$, where $V_{RAMP}$ is a value of the ramp voltage at an end of the switching period of the Buck converter, and $V_{REF}$ is the reference voltage.

Example 13. In accordance with an embodiment, an integrated circuit (IC) device includes: one or more switches of a Buck converter; and a control circuit for the Buck converter, comprising: a comparator configured to generate a comparator output signal by comparing a feedback voltage of the Buck converter with a compensation ramp voltage; a pulse generator configured to generate a pulse signal in response to a rising edge in the comparator output signal, wherein the Buck converter is configured to be controlled by a switching control signal derived from the pulse signal; a transconductance amplifier configured to generate, at an output terminal of the transconductance amplifier, a current proportional to a difference between a reference voltage and the feedback voltage; a first capacitor coupled between an output terminal of the transconductance amplifier and a reference voltage node; and a ramp signal generator configured to generate the compensation ramp voltage by adding a first voltage at the output terminal of the transconductance amplifier and a ramp voltage generated by the ramp signal generator, wherein the ramp voltage is a linear voltage signal having a gradient proportional to a switching frequency of the Buck converter.

Example 14. The IC device of Example 13, wherein the pulse signal has a fixed pulse width.

Example 15. The IC device of Example 13, wherein in a steady state of the Buck converter, a value of the ramp voltage at an end of a switching period of the Buck converter has a fixed value, wherein the fixed value is independent of the switching frequency of the Buck converter.

Example 16. The IC device of Example 13, wherein the gradient of the linear voltage signal is equal to or larger than $S_x$, where $S_x = K \times f_{swx} \times \Delta V_{out}$, $\Delta V_{out}$ is the Buck converter's output voltage ripple, $f_{swx}$ is the switching frequency of the Buck converter, and K is a constant value.

Example 17. The IC device of Example 13, wherein the ramp signal generator comprises: a phase tracking circuit configured to track the switching frequency of the Buck converter and generate an output signal proportional to the switching frequency of the Buck converter; and a ramp generation circuit configured to, based on the output signal of the phase tracking circuit: generate the ramp voltage having the gradient proportional to the switching frequency of the Buck converter; and add the ramp voltage to the first voltage at the output terminal of the transconductance amplifier to generate the compensation ramp voltage.

Example 18. In accordance with an embodiment, a method of operating a Buck converter includes: dividing an output voltage of the Buck converter to generate a feedback voltage; sending the feedback voltage to a first input terminal of a comparator; sending the feedback voltage and a reference voltage to a first input terminal of a transconductance amplifier and a second input terminal of the transconductance amplifier, respectively; generating, using a ramp signal generator, a compensation ramp voltage that is equal to a sum of a first voltage at an output terminal of the transconductance amplifier and a ramp voltage, wherein the ramp voltage is a linear voltage signal having a gradient that is proportional to a switching frequency of the Buck converter; sending the compensation ramp voltage to a second input terminal of the comparator; generating, using a pulse generator, a pulse signal comprising pulses corresponding to rising edges in an output signal of the comparator; and switching the Buck converter under control of a switching control signal derived from the pulse signal.

Example 19. The method of Example 18, wherein the pulses of the pulse signal are generated to have a fixed pule width.

Example 20. The method of Example 19, further comprising charging a capacitor with an output current generated by the transconductance amplifier, wherein the capacitor is coupled between the output terminal of the transconductance amplifier and a reference voltage node.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A switched-mode power supply (SMPS) comprising:
   a Buck converter; and
   a control circuit for the Buck converter, comprising:
      a comparator configured to compare a feedback voltage of the Buck converter with a compensation ramp voltage;
      a pulse generator coupled to an output terminal of the comparator and configured to generate a pulse signal in response to a rising edge in an output signal of the comparator, wherein switching of the Buck converter is controlled by the pulse signal;
      a transconductance amplifier, wherein a first input terminal of the transconductance amplifier is configured to receive the feedback voltage, and a second input terminal of the transconductance amplifier is configured to receive a reference voltage;
      a first capacitor coupled between an output terminal of the transconductance amplifier and a reference voltage node; and
      a ramp signal generator configured to generate a ramp voltage and add the ramp voltage to a first voltage at the output terminal of the transconductance amplifier to generate the compensation ramp voltage, wherein the ramp voltage is a linear voltage signal, and a gradient of the linear voltage signal is proportional to a switching frequency of the Buck converter.

2. The SMPS of claim 1, wherein in a steady state of the Buck converter, a value of the ramp voltage at an end of a switching period of the Buck converter has a fixed value, wherein the fixed value is independent of the switching frequency of the Buck converter.

3. The SMPS of claim 2, further comprising:
a logic circuit configured to derive, from the pulse signal, a switching control signal for the Buck converter, wherein the switching control signal controls switching of one or more switches of the Buck converter; and
an edge detector configured to generate a control signal for the ramp signal generator by detecting a rising edge in the switching control signal.

4. The SMPS of claim 2, wherein the pulse signal has a fixed pulse width.

5. The SMPS of claim 2, wherein a gradient of the linear voltage signal is equal to or larger than $S_x$, where $S_x = K \times f_{swx} \times \Delta V_{out}$, $\Delta V_{out}$ is the Buck converter's output voltage ripple, $f_{swx}$ is the switching frequency of the Buck converter, and K is a constant value.

6. The SMPS of claim 1, further comprising:
a voltage divider coupled between an output terminal of the Buck converter and the reference voltage node, wherein the voltage divider comprising a first resistor and a second resistor coupled in series; and
a feed-forward capacitor coupled between the output terminal of the Buck converter and a node between the first resistor and the second resistor.

7. The SMPS of claim 1, wherein the ramp signal generator comprises:
a phase-locked loop (PLL) configured to track the switching frequency of the Buck converter and generate an output current signal proportional to the switching frequency of the Buck converter;
an operational amplifier, wherein a non-inverting input terminal of the operational amplifier is coupled to the output terminal of the transconductance amplifier, and an inverting input terminal of the operational amplifier is coupled to an output terminal of the PLL;
a second capacitor coupled between the inverting input terminal of the operational amplifier and an output terminal of the operational amplifier; and
a switch coupled in parallel to the second capacitor, wherein the switch is configured to be closed for a period of time at a beginning of a switching period of the Buck converter.

8. The SMPS of claim 1, wherein the ramp signal generator comprises:
a phase-locked loop (PLL) configured to track the switching frequency of the Buck converter and generate a first current signal proportional to the switching frequency of the Buck converter;
a ramp current generator configured to generate a second current signal that increases linearly in a switching period of the Buck converter, wherein a gradient of the second current signal is proportional to a value of the first current signal;
an operational amplifier, wherein a non-inverting input terminal of the operational amplifier is coupled to the output terminal of the transconductance amplifier, and an inverting input terminal of the operational amplifier is coupled to an output terminal of the ramp current generator;
a resistor coupled between the inverting input terminal of the operational amplifier and an output terminal of the operational amplifier; and
a switch coupled in parallel to the resistor, wherein the switch is configured to be closed for a period of time at a beginning of the switching period of the Buck converter.

9. The SMPS of claim 1, wherein the ramp signal generator comprises:
a first adjustable current source, wherein the first adjustable current source is configured to be controlled by a first adjustment signal and to generate a first supply current proportional to the switching frequency of the Buck converter;
a first operational amplifier, wherein a non-inverting input terminal of the first operational amplifier is coupled to the output terminal of the transconductance amplifier, and an inverting input terminal of the first operational amplifier is coupled to the first adjustable current source;
a second capacitor coupled between the inverting input terminal of the first operational amplifier and an output terminal of the first operational amplifier; and
a first switch coupled in parallel to the second capacitor, wherein the first switch is configured to be closed for a period of time at a beginning of a switching period of the Buck converter.

10. The SMPS of claim 9, wherein the ramp signal generator further comprises:
a second adjustable current source, wherein the second adjustable current source is configured to be controlled by a second adjustment signal and to generate a second supply current;
a third capacitor coupled between the second adjustable current source and the reference voltage node;
a second switch coupled in parallel to the third capacitor, wherein the second switch and the first switch are controlled by a same control signal;
a second operational amplifier, wherein a non-inverting input terminal of the second operational amplifier is configured to receive a voltage equal to half of the reference voltage;
a resistor coupled between an inverting input terminal of the second operational amplifier and a node between the second adjustable current source and the third capacitor;
a fourth capacitor coupled between the inverting input terminal of the second operational amplifier and an output terminal of the second operational amplifier;
a first gain circuit coupled to the output terminal of the second operational amplifier and configured to generate the first adjustment signal; and
a second gain circuit coupled to the output terminal of the second operational amplifier and configured to generate the second adjustment signal.

11. The SMPS of claim 10, wherein the second capacitor and the third capacitor have a same capacitance, wherein the second gain circuit has a transconductance gain $G_m$, and the first gain circuit has a transconductance gain $G_m \times V_{RAMP}/V_{REF}$, where $V_{RAMP}$ IS a value of the ramp voltage at an end of the switching period of the Buck converter, and $V_{REF}$ is the reference voltage.

12. An integrated circuit (IC) device comprising:
one or more switches of a Buck converter; and
a control circuit for the Buck converter, comprising:
a comparator configured to generate a comparator output signal by comparing a feedback voltage of the Buck converter with a compensation ramp voltage;
a pulse generator configured to generate a pulse signal in response to a rising edge in the comparator output signal, wherein the Buck converter is configured to be controlled by a switching control signal derived from the pulse signal;

a transcendence amplifier configured to generate, at an output terminal of the transconductance amplifier, a current proportional to a difference between a reference voltage and the feedback voltage;

a first capacitor coupled between an output terminal of the transconductance amplifier and a reference voltage node; and a ramp signal generator configured to generate the compensation ramp voltage by adding a first voltage at the output terminal of the transconductance amplifier and a ramp voltage generated by the ramp signal generator, wherein the ramp voltage is a linear voltage signal having a gradient proportional to a switching frequency of the Buck converter.

13. The IC device of claim 12, wherein the pulse signal has a fixed pulse width.

14. The IC device of claim 12, wherein in a steady state of the Buck converter, a value of the ramp voltage at an end of a switching period of the Buck converter has a fixed value, wherein the fixed value is independent of the switching frequency of the Buck converter.

15. The IC device of claim 12, wherein the gradient of the linear voltage signal is equal to or larger than $S_x$, where $S_x = K \times f_{swx} \times \Delta V_{out}$, $\Delta V_{out}$ is the Buck converter's output voltage ripple, $f_{swx}$ is the switching frequency of the Buck converter, and K is a constant value.

16. The IC device of claim 12, wherein the ramp signal generator comprises:
a phase-locked loop (PLL) circuit configured to track the switching frequency of the Buck converter and generate an output signal, wherein a value of the output signal is proportional to the switching frequency of the Buck converter; and a ramp generation circuit configured to, based on the output signal of the PLL circuit:

generate the ramp voltage having the gradient proportional to the switching frequency of the Buck converter; and add the ramp voltage to the first voltage at the output terminal of the transconductance amplifier to generate the compensation ramp voltage.

17. A method of operating a Buck converter, the method comprising:
dividing an output voltage of the Buck converter to generate a feedback voltage;

sending the feedback voltage to a first input terminal of a comparator;

sending the feedback voltage and a reference voltage to a first input terminal of a transconductance amplifier and a second input terminal of the transconductance amplifier, respectively;

generating, using a ramp signal generator, a compensation ramp voltage that is equal to a sum of a first voltage at an output terminal of the transconductance amplifier and a ramp voltage, wherein the ramp voltage is a linear voltage signal having a gradient that is proportional to a switching frequency of the Buck converter;

sending the compensation ramp voltage to a second input terminal of the comparator;

generating, using a pulse generator, a pulse signal comprising pulses corresponding to rising edges in an output signal of the comparator; and switching the Buck converter under control of a switching control signal derived from the pulse signal.

18. The method of claim 17, wherein the pulses of the pulse signal are generated to have a fixed pulse width.

19. The method of claim 18, further comprising charging a capacitor with an output current generated by the transconductance amplifier, wherein the capacitor is coupled between the output terminal of the transconductance amplifier and a reference voltage node.

* * * * *